United States Patent
Jeong et al.

(10) Patent No.: US 9,401,359 B2
(45) Date of Patent: Jul. 26, 2016

(54) SEMICONDUCTOR DEVICE

(71) Applicant: SAMSUNG ELECTRONICS CO., LTD., Suwon-si, Gyeonggi-do (KR)

(72) Inventors: Soo-Yeon Jeong, Bucheon-si (KR); Myeong-Cheol Kim, Suwon-si (KR); Do-Hyoung Kim, Hwaseong-si (KR); Do-Haing Lee, Hwaseong-si (KR); Nam-Myun Cho, Seoul (KR); In-Ho Kim, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/553,665

(22) Filed: Nov. 25, 2014

(65) Prior Publication Data

US 2015/0076616 A1    Mar. 19, 2015

Related U.S. Application Data

(63) Continuation of application No. 13/307,270, filed on Nov. 30, 2011, now Pat. No. 8,900,944.

(30) Foreign Application Priority Data

Dec. 16, 2010   (KR) .................. 10-2010-0129263

(51) Int. Cl.
| | |
|---|---|
| *H01L 21/02* | (2006.01) |
| *H01L 27/088* | (2006.01) |
| *H01L 21/768* | (2006.01) |
| *H01L 21/285* | (2006.01) |
| *H01L 29/49* | (2006.01) |
| *H01L 29/66* | (2006.01) |
| *H01L 29/45* | (2006.01) |

(52) U.S. Cl.
CPC ........ *H01L 27/088* (2013.01); *H01L 21/28518* (2013.01); *H01L 21/76897* (2013.01); *H01L 29/45* (2013.01); *H01L 29/49* (2013.01); *H01L 29/66545* (2013.01)

(58) Field of Classification Search
CPC ................... H01L 21/28052; H01L 21/28026; H01L 29/66545; H01L 21/76897; H01L 21/28518
See application file for complete search history.

(56) References Cited

U.S. PATENT DOCUMENTS

| | | | |
|---|---|---|---|
| 6,174,803 B1 * | 1/2001 | Harvey | 438/638 |
| 6,417,055 B2 | 7/2002 | Jang et al. | |
| 6,887,747 B2 | 5/2005 | Yagishita et al. | |
| 6,977,228 B2 * | 12/2005 | Kohyama et al. | 438/706 |
| 2004/0192026 A1 | 9/2004 | Chen et al. | |
| 2007/0069300 A1 * | 3/2007 | Cheng et al. | 257/368 |
| 2008/0079155 A1 | 4/2008 | Mule et al. | |
| 2008/0135903 A1 * | 6/2008 | Hu | 257/296 |
| 2008/0258216 A1 | 10/2008 | Kikuchi | |

FOREIGN PATENT DOCUMENTS

JP    2002-094058 A    3/2002

* cited by examiner

*Primary Examiner* — Bradley K Smith
(74) *Attorney, Agent, or Firm* — Lee & Morse, P.C.

(57) ABSTRACT

A method of manufacturing a semiconductor device includes forming a gate structure through a first insulating interlayer on a substrate such that the gate structure includes a spacer on a sidewall thereof, forming a first hard mask on the gate structure, partially removing the first insulating interlayer using the first hard mask as an etching mask to form a first contact hole such that the first contact hole exposes a top surface of the substrate, forming a metal silicide pattern on the top surface of the substrate exposed by the first contact hole, and forming a plug electrically connected to the metal silicide pattern.

20 Claims, 10 Drawing Sheets

SEMICONDUCTOR DEVICE

CROSS-REFERENCE TO RELATED APPLICATIONS

This is a continuation application based on pending application Ser. No. 13/307,270, filed Nov. 30, 2011, the entire contents of which is hereby incorporated by reference.

Korean Patent Application No. 10-2010-0129263 filed on Dec. 16, 2010, in the Korean Intellectual Property Office, and entitled, "Methods of Manufacturing a Semiconductor Device," is incorporated by reference herein its entirety.

BACKGROUND

Methods of manufacturing a semiconductor device including a metal gate have been developed.

SUMMARY

Embodiments may be realized by providing a method of manufacturing a semiconductor device that includes forming a gate structure through a first insulating interlayer on a substrate such that the gate structure includes a spacer on a sidewall thereof, forming a first hard mask on the gate structure, partially removing the first insulating interlayer using the first hard mask as an etching mask to form a first contact hole such that the first contact hole exposes a top surface of the substrate, forming a metal silicide pattern on the top surface of the substrate exposed by the first contact hole, and forming a plug electrically connected to the metal silicide pattern.

The metal silicide pattern may be self-aligned with the spacer, and the plug may be self-aligned with the spacer and the first hard mask. Forming the gate structure may include forming a dummy gate structure on the substrate, forming the spacer on a sidewall of the dummy gate structure, forming the first insulating interlayer on the substrate to cover the dummy gate structure and the spacer, planarizing an upper portion of the first insulating interlayer to expose the dummy gate structure, removing the exposed dummy gate structure to form an opening, and forming the gate structure in the opening.

Forming the dummy gate structure may include forming a dummy gate insulation layer pattern, forming a dummy gate electrode, and forming a dummy gate mask. Planarizing the upper portion of the first insulating interlayer may be performed until a top surface of the dummy gate electrode is exposed.

The first hard mask and the spacer may be formed using silicon nitride, and the first insulating interlayer may be formed using silicon oxide. The method may include forming a second hard mask on the first hard mask such that the second hard mask may include a silicon based spin-on hard mask (Si—SOH).

Forming the first and second hard masks may include forming a first hard mask layer on the gate structures and the first insulating interlayer, forming the second hard mask on the first hard mask layer, and patterning the first hard mask layer using the second hard mask as an etching mask to form the first hard mask.

Forming the plug may include forming a second insulating interlayer on the first hard mask, the spacer, and the metal silicide pattern such that the second insulating interlayer may fill the first contact hole, partially removing the second insulating interlayer to form a second contact hole, the second contact hole may expose the metal silicide pattern, forming a conductive layer on the first hard mask, the conductive layer may fill the second contact hole, and planarizing the conductive layer until a top surface of the first hard mask is exposed. The method may include forming an offset spacer on sidewalls of the first hard mask, on sidewalls of the spacer, and on a portion of the metal silicide pattern prior to forming the plug.

Embodiments may also be realized by providing a method of manufacturing a semiconductor device that includes forming first and second gate structures through a first insulating interlayer on first and second regions of a substrate, respectively, the first and second gate structures include first and second spacers on respective sidewalls thereof, forming a first hard mask on the first and second gate structures, partially removing the first insulating interlayer using the first hard mask as an etching mask to form a first contact hole, the first contact hole exposes a top surface of the first region of the substrate, forming a metal silicide pattern on the top surface of the first region of the substrate exposed by the first contact hole, and forming a first plug electrically connected to the metal silicide pattern.

The first region may be a cell region and the second region may be a peripheral circuit region. The metal silicide pattern may be self-aligned with the first spacer, and the first plug may be self-aligned with the first spacer and the first hard mask.

The method may include forming a second plug electrically connected to the second gate structure. The method may include forming an offset spacer on sidewalls of the first hard mask, on sidewalls of the first spacer, and on a portion of the metal silicide pattern prior to forming the first plug.

Embodiments may also be realized by providing a method of manufacturing a semiconductor device that includes forming a dummy gate structure on a substrate such that the dummy gate structure includes a spacer on sidewalls thereof, forming a first insulating interlayer surrounding the dummy gate structure, removing the dummy gate structure to form a void surrounded by the spacer, forming a gate structure in the void, forming a first hard mask covering the gate structure and the spacer, partially removing the first insulating interlayer using the first hard mask as an etching mask to form a first contact hole adjacent to the spacer, the first contact hole exposes an impurity region of the substrate, forming a metal silicide pattern on the impurity region exposed by the first contact hole, and forming a plug in the first contact hole, the plug being electrically connected to the metal silicide pattern.

Forming the metal silicide pattern may include self-aligned the metal silicide pattern using the spacer. Forming the plug may include self-aligned the plug using the spacer and the first hard mask. The metal silicide pattern may be adjacent to the spacer and the plug may be adjacent to the spacer and the first hard mask.

The method may include forming an offset spacer on sidewalls of the first hard mask, on sidewalls of the first spacer, and on a portion of the metal silicide pattern prior to forming the first plug. Forming the plug may include depositing a conductive layer on the offset spacer, and the metal silicide pattern may be formed before depositing the conductive layer. The method may include forming a second insulating interlayer overlapping the first hard mask after forming the plug in the first contact hole, and forming wirings on the second insulating interlayer.

BRIEF DESCRIPTION OF THE DRAWINGS

Features will become apparent to those of ordinary skill in the art by describing in detail exemplary embodiments with reference to the attached drawings, in which.

DETAILED DESCRIPTION OF THE EMBODIMENTS

Figure 1:
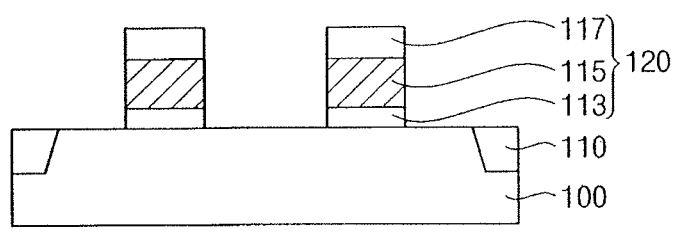
FIGS. 1 to 11 illustrate cross-sectional views depicting stages in a method of manufacturing a semiconductor device, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, example embodiments will be explained in detail with reference to the accompanying drawings.

FIGS. 1 to 11 illustrate cross-sectional views depicting stages in an exemplary method of manufacturing a semiconductor device.

Referring to FIG. 1, a dummy gate insulation layer, a dummy gate electrode layer, and a dummy gate mask layer (not illustrated) may be formed sequentially on a substrate 100. The dummy gate mask layer, the dummy gate electrode layer, and the dummy gate insulation layer may be partially and sequentially removed by at least one photolithography process to form a dummy gate structure 120. The dummy gate structure 120 may include a dummy gate insulation layer pattern 113, a dummy gate electrode 115, and a dummy gate mask 117 sequentially stacked on the substrate 100. A plurality of dummy gate structures 120 may be formed on the substrate 100 from the dummy gate insulation layer, the dummy gate electrode layer, and the dummy gate mask layer.

The substrate 100 may include a semiconductor substrate, e.g., a silicon substrate, a germanium substrate, a silicon-germanium substrate, a silicon-on-insulator (SOI) substrate, a germanium-on-insulator (GOI) substrate, etc. The substrate 100 may further include a well region (not illustrated) doped with p-type and/or n-type impurities. An isolation layer 110 may be formed on the substrate 100, e.g., by a shallow trench isolation (STI) process, to define an active region and a field region in the substrate 100.

The dummy gate insulation layer may be formed on the substrate 100 using an oxide, e.g., a silicon oxide. The dummy gate insulation layer may be formed by, e.g., a chemical vapor deposition (CVD) process. Alternatively, the dummy gate insulation layer may be formed by, e.g., performing a thermal oxidation on a top surface of the substrate 100.

The dummy gate electrode layer may be formed on, e.g., directly on an upper surface of, the dummy gate insulation layer. The dummy gate electrode layer may include and/or be formed of, e.g., polysilicon. The dummy gate electrode layer may be formed using one of, e.g., a CVD process, a physical vapor deposition (PVD) process, an atomic layer deposition (ALD) process, etc.

The dummy gate mask layer may be formed on, e.g., directly on an upper surface of, the dummy gate electrode layer. The dummy gate mask layer may include and/or be formed of at least one of, e.g., silicon nitride ($SiN_x$) and silicon oxynitride (SiON). The dummy gate mask layer may be formed using one of, e.g., a CVD process, a PVD process, an ALD process, etc.

Figure 2:
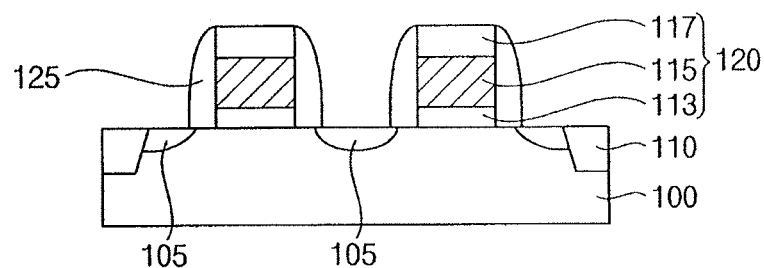

Referring to FIG. 2, a spacer 125 may be formed on a sidewall of the dummy gate structure 120. For example, each dummy gate structure 120 may include the spacer 125 on opposing sidewalls thereof. Impurity regions 105 may be formed at upper portions of the substrate 100. The impurity regions 105 may be adjacent to the dummy gate structure 120. For example, each impurity region 105 may be adjacent to at least one spacer 125 on a sidewall of one dummy gate structure 120. The spacers 125 may overlap portions of the impurity regions 105.

According to an exemplary embodiment, a spacer layer (not illustrated) may be formed on the substrate 100 to cover the dummy gate structures 120. The spacer layer may be etched, e.g., anisotropically etched, to form the spacers 125. For example, the spacer layer may be formed using silicon nitride. However, embodiments are not limited thereto. The impurity regions 105 may be formed by performing an ion-implantation process on the substrate 100 using, e.g., the adjacent dummy gate structure 120 and the adjacent one of the spacers 125 as an ion-implantation mask. Accordingly, the impurity regions 105 may be formed after forming the spacers 135.

Figure 3:
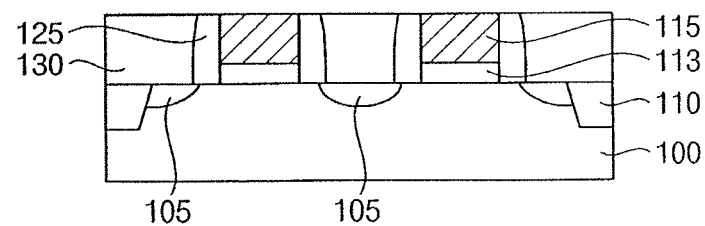

Referring to FIG. 3, a first insulating interlayer 130 may be formed on the substrate 100 to cover the impurity regions 105, the dummy gate structures 120, and the spacers 125. Thereafter, an upper portion of the first insulating interlayer 130 may be planarized. According to an exemplary embodiment, the dummy gate mask 117 of the dummy gate structures 120 and an upper portion of the spacers 125 may be removed during the planarization process of the first insulating interlayer 130. For example, an upper surface of the planarized first insulating interlayer 130 may be substantially coplanar with an upper surface of the dummy gate structure 120, e.g., an upper surface of the dummy gate electrode 115.

The first insulating interlayer 130 may be formed using, e.g., an oxide. The first insulating interlayer 130 may include at least one of, e.g., phosphor silicate glass (PSG), borophosphor silicate glass (BPSG), undoped silicate glass (USG), tetra ethyl ortho silicate (TEOS), plasma enhanced-TEOS (PE-TEOS), high density plasma-chemical vapor deposition (HDP-CVD) oxide, etc. The first insulating layer 130 may be formed by, e.g., a CVD process, a plasma-enhanced CVD (PECVD) process, a spin coating process, a HDP-CVD process, etc. The upper portion of the first insulating interlayer 130 may be planarized by, e.g., a chemical mechanical polish (CMP) process. According to an exemplary embodiment, the first insulating interlayer 130 may be planarized until top surfaces of the dummy gate electrodes 115 of the dummy gate structure 120 are exposed. Thus, at least the dummy gate mask 117 of the dummy gate structure 120 may be removed during the planarization process.

Figure 4:
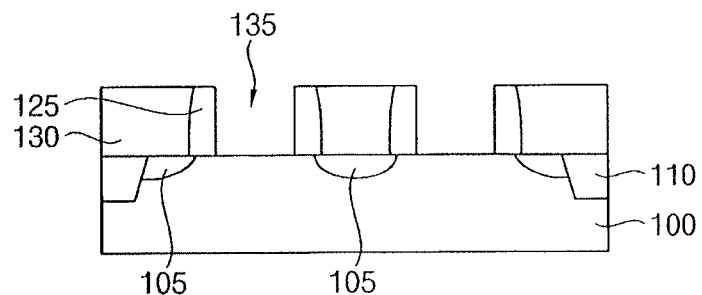

Referring to FIG. 4, the dummy gate electrode 115 and the dummy gate insulation layer pattern 113 may be removed to form an opening 135, e.g., a void between and/or surrounded by the spacer 125, that exposes the top surface of the substrate 100. For example, a plurality of openings 135 may be formed on the substrate 100. The dummy gate electrode 115 and the dummy gate insulation layer pattern 113 may be removed by, e.g., a dry etching process or a wet etching process. According to an exemplary embodiment, the dummy gate insulation layer pattern 113 may not be removed, such that the dummy gate insulation layer pattern 113 may be exposed during the formation of the openings 135. The dummy gate insulation layer pattern 113 may form bottom surfaces of the openings 135 so that the dummy gate insulation layer pattern 113 may serve as a gate insulation layer together with a later formed gate insulation layer pattern 143 (see FIG. 5). The spacers 125 may remain adjacent to the openings 135, e.g., the spacers 125 may not be substantially etched during the removal of the dummy gate electrode 115 and the dummy gate insulation layer pattern 113.

Figure 5:
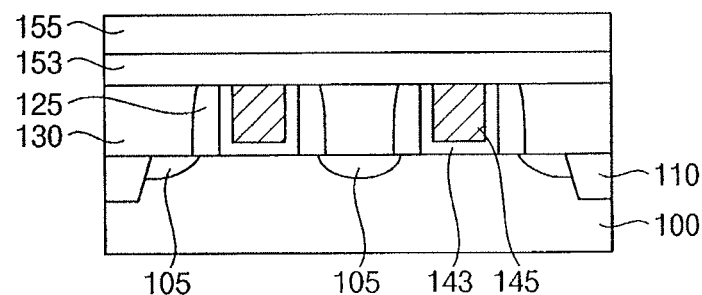

Referring to FIG. 5, a gate insulation layer (not illustrated) may be formed on the exposed top surface of the substrate 100, sidewalls of the openings 135, the spacers 125, and the first insulating interlayer 130. A gate electrode layer (not illustrated) may be formed on the gate insulation layer to fill, e.g., completely fill, a remaining portion of the opening 135. The gate electrode layer and the gate insulation layer may be planarized until, e.g., a top surface of the first insulating interlayer 130 is exposed to form a gate electrode 145 and the gate insulation layer pattern 143, respectively. The gate insulation layer pattern 143 and the gate electrode 145 may be sequentially stacked in the opening 135. According to an exemplary embodiment, the gate insulation layer pattern 143 may surround the gate electrode 145 in the opening 135, e.g., the gate insulation layer pattern 143 may be between the gate electrode 145 the adjacent spacers 125. Upper surfaces the spacers 125, upper surfaces of the gate insulation layer patterns 143, and upper surfaces of the gate electrodes 145 may be substantially coplanar. The gate insulation layer pattern 143 and the gate electrode 145 may define a gate structure.

The gate insulation layer pattern 143 may include and/or be formed of, e.g., a metal oxide that may have a high dielectric constant. For example, the metal oxide may include at least one of hafnium oxide, hafnium silicon oxide, zirconium oxide, zirconium silicon oxide, hafnium oxynitride, hafnium silicon oxynitride, zirconium oxynitride, zirconium silicon oxynitride, aluminium oxide, hafnium aluminium oxide, lanthanum oxide, hafnium lanthanum oxide, zirconium aluminium oxide, aluminium oxynitride, hafnium aluminium oxynitride, lanthanum oxinitride, hafnium lanthanum oxynitride, zirconium aluminium oxynitride, etc. These may be used alone or in a various combinations thereof.

The gate electrode 145 may include and/or be formed of, e.g., a metal and/or a metal nitride. The metal and/or metal nitride may include e.g., at least one of aluminium (Al), titanium (Ti), titanium nitride (TiN), and tungsten (W). The gate electrode 145 may be formed by, e.g., a PVD process, an ALD process, etc.

After forming the gate structure, a first hard mask layer 153 and a second hard mask layer 155 may be formed sequentially on the first insulating interlayer 130, the spacer 125, the gate insulation layer pattern 143, and the gate electrode 145.

The first hard mask layer 153 may include and/or be formed of, e.g., silicon nitride. However, embodiments are not limited thereto. The second hard mask layer 155 may include and/or be formed of, e.g., at least one of a spin-on glass (SOG) layer, a silicon based spin-on hard mask (Si—SOH) layer, and a carbon based spin-on hard mask (C—SOH) layer. A second hard mask (not illustrated) subsequently formed from the second hard mask layer 155 may reduce the possibility of and/or prevent a first hard mask 153a (see FIG. 6) from being damaged during a subsequent etching process. In an example embodiment, the second hard mask layer 155 may not be formed, e.g., only the first hard mask layer 153 may be formed.

Figure 6:
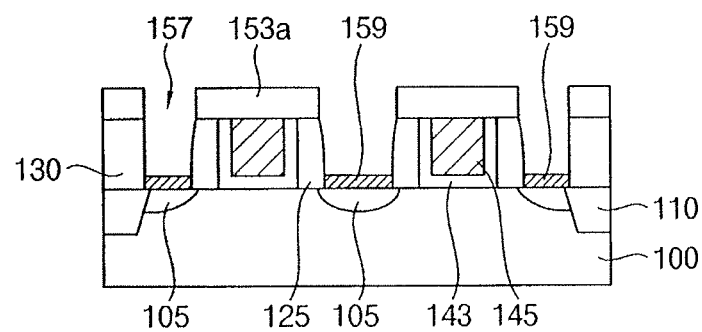

Referring to FIG. 6, the first hard mask layer 153 may be patterned to form the first hard mask 153a. The first hard mask 153a may overlap, e.g., completely overlap, the gate insulation layer pattern 143 and the gate electrode 145 defining one gate structure and the spacers 125 adjacent to the one gate structure. The first insulating interlayer 130 may be partially removed using the first hard mask 153a as an etching mask to expose the impurity regions 105. For example, portions of the first insulating interlayer 130 abutting the spacers 125, which are adjacent to the one gate structure, may be removed.

According to an exemplary embodiment, a photoresist pattern (not illustrated) may be formed on the second hard mask layer 155. The second hard mask layer 155 may be partially removed using the photoresist pattern as an etching mask to form the second hard mask. After removing the photoresist pattern, the first hard mask layer 153 may be patterned using the second hard mask as an etching mask to form the first hard mask 153a. The first insulating interlayer 130 may be partially removed using the first hard mask 153a as an etching mask to form first contact holes 157 exposing the impurity regions 105. During the etching process, the second hard mask may be partially or entirely removed, while the first hard mask 153a may remain on the gate structure and/or the spacer 125.

The first insulating interlayer 130 may be partially removed by, e.g., a dry etching process or a wet etching process. For example, the first insulating interlayer 130 may be partially removed using, e.g., an etching solution or an etching gas that may have a high etching selectivity between silicon oxide and silicon nitride.

After forming the first contact holes 157, a metal silicide pattern 159 may be formed on each impurity region 105. The metal silicide pattern 159 may form a bottom surface of the first contact holes 157, e.g., the metal silicide pattern 159 may extend across substantially an entire bottom surface of the first contact holes 157.

According to an exemplary embodiment, a metal layer (not illustrated) may be formed on the impurity regions 105, the spacer 125, and the first hard mask 153a. Thereafter, an annealing process, e.g., a rapid thermal annealing (RTA) process, may be performed on the metal layer. Thus, the metal silicide layer patterns may be formed on the impurity regions 105 including silicon. A portion of the metal layer formed on the spacer 125 and the first hard mask 153a that is not reacted with silicon atoms may be removed. For example, each metal silicide pattern 159 may be formed in a self-aligned manner by the spacer 125 and/or the first hard mask 153a. For example, the metal silicide pattern 159 may be formed through a void defined by the sidewalls of the spacer 125 and sidewalls of the first hard mask 153a.

The metal layer may be formed using a metal, e.g., at least one of cobalt (Co), platinum (Pt), and nickel (Ni). For example, when the metal layer includes nickel, the metal silicide patterns 159 may include nickel silicide (NiSi).

Figure 7:
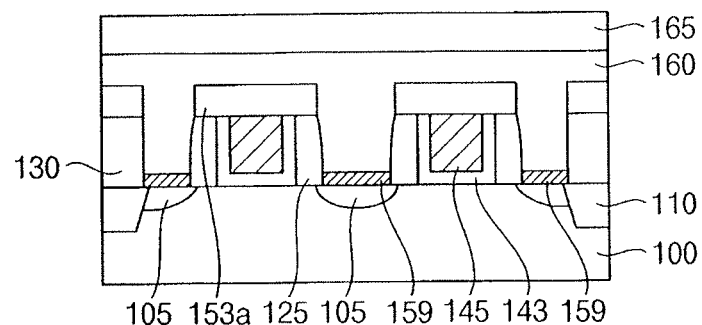

Referring to FIG. 7, a second insulating interlayer 160 may be formed on the metal silicide patterns 159, the spacer 125, and the first hard mask 153a. Lower portions of the second insulating interlayer 160 may sufficiently fill, e.g., completely fill, the remaining portions of the first contact holes 157. Accordingly, the lower portions of the second insulating interlayer 160 may be on, e.g., in contact with, the metal silicide patterns 159. An upper portion of the second insulating interlayer 160 may be formed to cover the first hard mask 153a. A third hard mask layer 165 may be formed on, e.g., directly on, the second insulating interlayer 160.

According to an exemplary embodiment, the second insulating interlayer 160 and the third hard mask layer 165 may be formed using substantially the same material as that of the first insulating interlayer 130 and the second hard mask layer 155, respectively. The second insulating interlayer 160 and the third hard mask layer 165 may be formed by, e.g., a CVD process, a PECVD process, a spin coating process, a HDP-CVD process, etc. Alternatively, the third hard mask layer 165 may not be formed, e.g., only the second insulating interlayer 160 may be formed.

Figure 8:
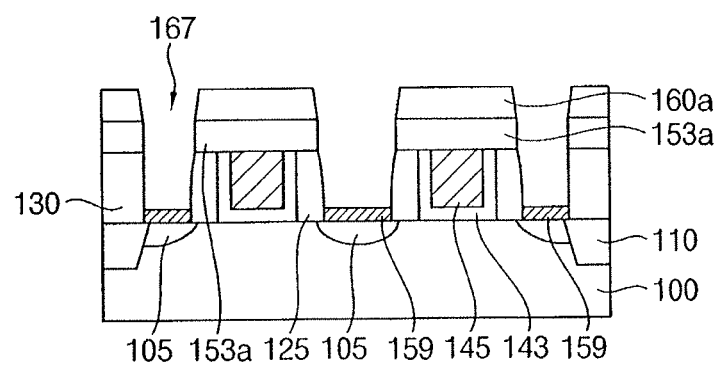

Referring to FIG. 8, a photoresist pattern (not illustrated) may be formed on the third hard mask layer 165. The third hard mask layer 165 may be partially removed using the photoresist pattern as an etching mask to form a third hard mask (not illustrated). Thereafter, the photoresist pattern may be removed. The second insulating interlayer 160 may be partially removed using the third hard mask as an etching mask to form second contact holes 167 that expose the metal silicide patterns 159. During the etching process, the third hard mask may be partially or entirely removed, and portions of the second insulating interlayer 160 may remain on, e.g. directly on, the first hard mask 153a. The portions of the second insulating interlayer 160 that remain after the etching process may form an insulating pattern 160a, e.g., an oxide layer pattern 160a.

Figure 9:
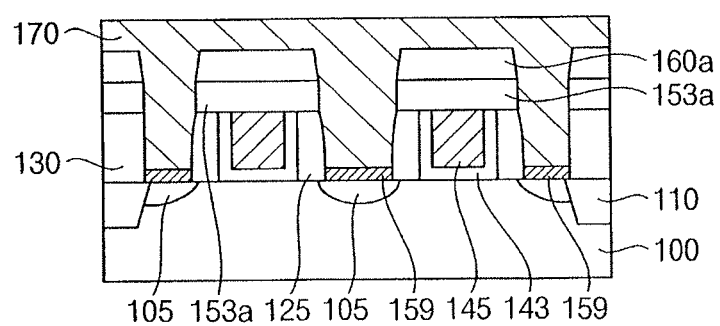

Referring to FIG. 9, a conductive layer 170 may be formed on the metal silicide patterns 159, the spacers 125, the first hard masks 153a, and the oxide layer patterns 160a. Lower portions of the conductive layer 170 may fill, e.g., completely fill, the second contact hole 167. The lower portions of the conductive layer 170 may be on, e.g., in contact with, the metal silicide patterns 159. An upper portion of the conductive layer 170 may cover the oxide layer patterns 160a. The conductive layer 170 may include and/or be formed of a metal, e.g., at least one of tungsten (W), aluminium (Al), tantalum (Ta), ruthenium (Ru), iridium (Ir), platinum (Pt), etc. According to an exemplary embodiment, the conductive layer 170 may be formed using tungsten.

Figure 10:
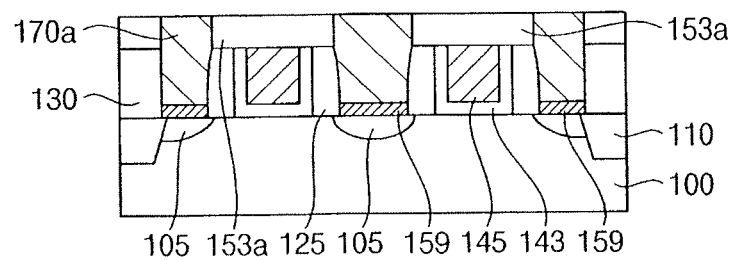

Referring to FIG. 10, the upper portion of the conductive layer 170 may be planarized by, e.g., a CMP and/or an etch-back process. The upper portion of the conductive layer 170 may be planarized until, e.g., a top surface of the first hard mask 153a is exposed. According to an exemplary embodiment, the oxide layer patterns 160a may be removed during the planarization process. For example, after the planarization process, portions of the lower portions of the conductive layer 170 may remain to form first plugs 170a in the second contact holes 167. The first plugs 170a may be electrically connected to the metal silicide patterns 159. According to an exemplary embodiment, each first plug 170a may be self-aligned with the first hard mask 153a and the spacer 125. For example, the first plug 170a may be formed in a void surrounding by the first hard mask 153a and the spacer 125. Thus, both the metal silicide patterns 159 and the first plugs 170a may be formed in a self-aligned manner by the first hard masks 153a and the spacers 125. An upper surface of the first plugs 170a may be substantially coplanar with a top surface of the first hard masks 153a.

Figure 11:
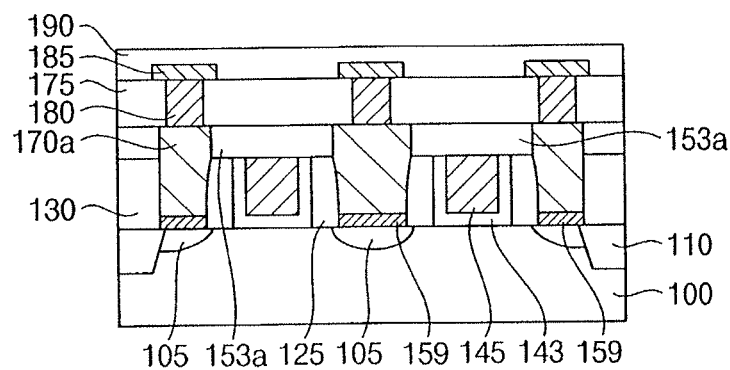

Referring to FIG. 11, a third insulating interlayer 175 may be formed on the first hard mask 153a and the first plugs 170a. Second plugs 180 may be formed through openings in the third insulating interlayer 175. The second plugs 180 may be electrically connected to the first plugs 170a, e.g., the second plugs 180 may overlap the first plugs 170a.

According to an exemplary embodiment, wirings 185 may be formed above the second plugs 180. The wirings 185 may be electrically connected to the second plugs 180. For example, both the second plugs 180 and the first plugs 170a may be under the wirings 185. A protection layer 190 may be formed on the third insulating interlayer 175 to cover the wirings 185, e.g., as illustrated in FIG. 11.

Figure 12:
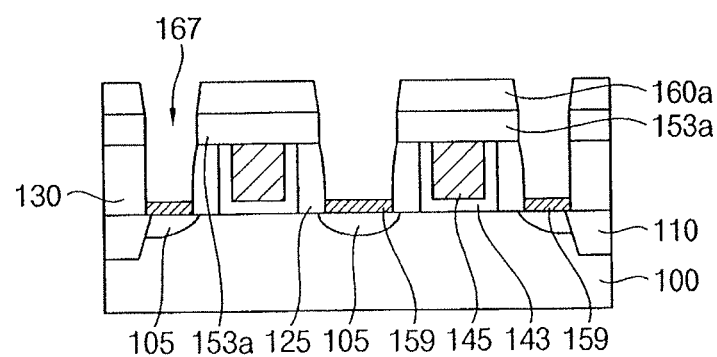
FIGS. 12 to 14 illustrate cross-sectional views depicting stages in a method of manufacturing a semiconductor device, according to an exemplary embodiment.
Figure 13:
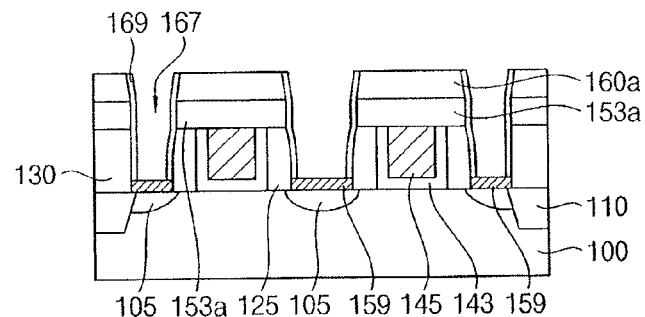
Figure 14:
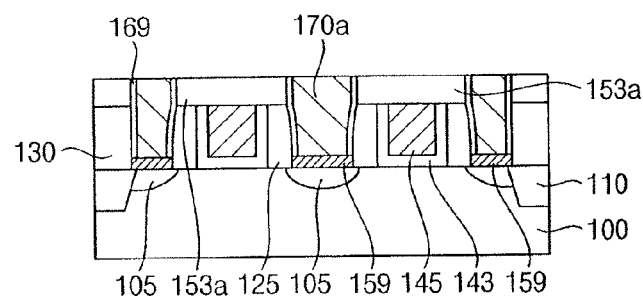

FIGS. 12 to 14 illustrate cross-sectional views depicting stages in an exemplary method of manufacturing a semiconductor device. The method of manufacturing the semiconductor device may be substantially the same as or similar to that illustrated with reference to FIGS. 1 to 11, except an offset spacer may be formed. Thus, like reference numerals refer to like elements, and repeated detailed explanations thereof may be omitted herein.

Referring to FIG. 12, a gate insulation layer pattern 143, a gate electrode 146, a spacer 125, a first hard mask 153a, an oxide layer pattern 160a, metal silicide patterns 159, and second contact holes 167 may be formed by performing stages substantially the same as or similar to those illustrated with reference to FIGS. 1 to 8.

Referring to FIG. 13, an offset spacer layer (not illustrated) may be formed on the metal silicide patterns 159, the spacer 125, the first hard mask 153a, and the oxide layer pattern 160a. For example, the offset spacer layer may include and/or be formed of silicon nitride. The offset layer may be partially removed to form offset spacers 169 in the second contact holes 167. According to an exemplary embodiment, the offset spacer layer may be partially removed by, e.g., a dry etching process. For example, one offset spacer 169 may be on a sidewall of the spacer 125, on a sidewall of the first hard mask 153a, and on a sidewall of the oxide layer pattern 160a in one contact hole 167. The offset spacer 169 may surround the second contact holes 167 such that the offset spacer 169 may be formed on the sidewalls of the second contact holes 167. The offset spacer 169 may be on, e.g., in contact with, the metal silicide patterns 159. Portions of the top surfaces of the metal silicide patterns 159 and the oxide layer pattern 160a may be exposed through the offset spacers 169.

Referring to FIG. 14, the first plugs 170a may be formed to fill the second contact holes 167 including the offset spacer 169 by, e.g., performing stages substantially the same as or similar to those illustrated with reference to FIGS. 9 and 10. By forming the offset spacer 169, an additional distance between each first plug 170a and the gate electrode 145 may be obtained.

For example, a conductive layer may be formed on the metal silicide patterns 159, the offset spacer 169 and the oxide layer pattern 160a to fill the second contact holes 167. The conductive layer may be partially planarized until a top surface of the first hard mask 153a is exposed to form the first plugs 170a. Accordingly, each first plug 170a may be formed in each second contact hole 167, e.g., in a self-aligned manner by the offset spacer 169.

FIGS. 15 to 22 illustrate cross-sectional views depicting stages in an exemplary method of manufacturing a semiconductor device. The method of manufacturing the semiconductor device may be substantially the same as or similar to that illustrated with reference to FIGS. 1 to 11, except that a substrate may be divided into a first region I and a second region II. Thus, detailed explanations of like elements may be omitted herein.

Figure 15:
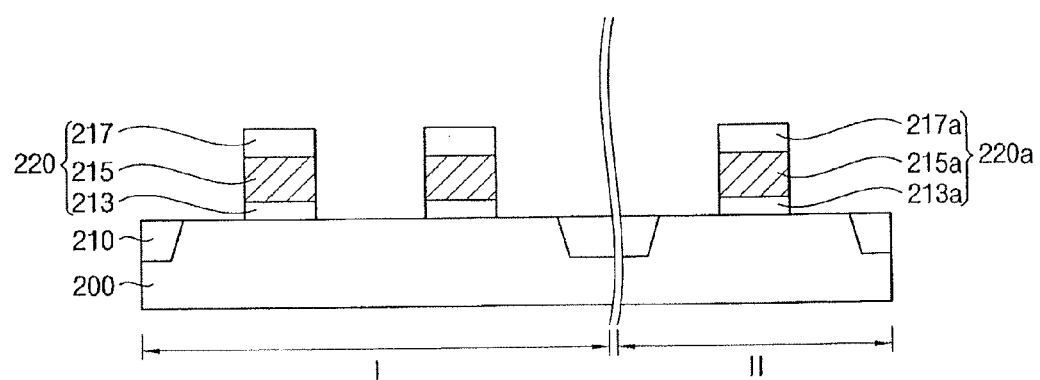
FIGS. 15 to 22 illustrate cross-sectional views depicting stages in a method of manufacturing a semiconductor device, according to an exemplary embodiment.

Referring to FIG. 15, a first dummy gate structure 220 and a second dummy gate structure 220a may be formed on a substrate 200 including isolation layers 210 thereon. The substrate 200 may be divided into a first region I and a second region II, e.g., by one of the isolation layers 210. The first and second gate structures 220 and 220a may be formed in the first and second regions I and II, respectively. According to an exemplary embodiment, the first region I may be a cell region and the second region II may be a peripheral circuit region.

The first and second dummy gate structures 220 and 220a may include first and second dummy gate insulation layer patterns 213 and 213a, first and second dummy gate electrodes 215 and 215a, and first and second dummy gate masks 217 and 217a, respectively.

Figure 16:
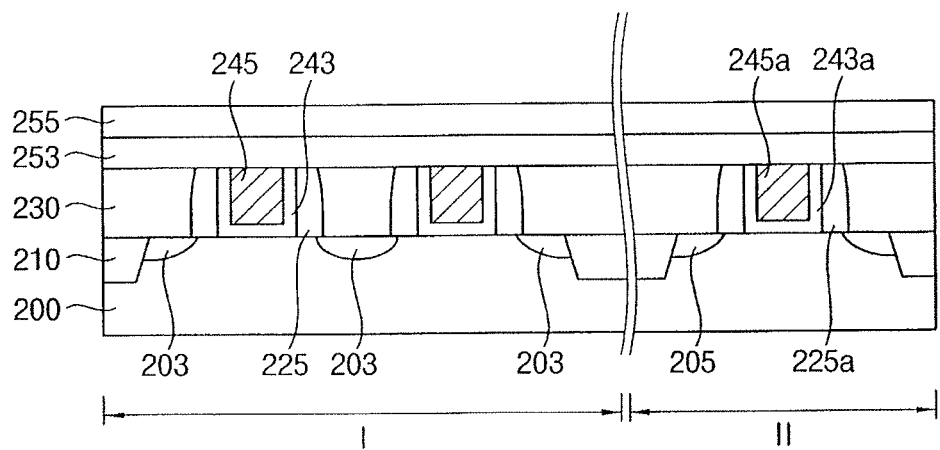

Referring to FIG. 16, stages substantially the same as or similar to those illustrated with reference to FIGS. 2 to 5 may be performed. For example, first and second spacers 225 and 225a may be formed on sidewalls of the first and second dummy gate electrodes 215 and 215a, and the first and second dummy gate insulation layer patterns 213 and 213a, respectively. First and second impurity regions 203 and 205 may be formed at upper portions of the first and second regions I and II of the substrate 200 adjacent to the first and second dummy gate structures 220 and 220a, respectively.

A first insulating interlayer 230 may be formed on the substrate 200 to cover the first and second dummy gate structures 220 and 220a, and the first and second spacers 225 and 225a. An upper portion of the first insulating interlayer 230 may be planarized until top surfaces of the first and second dummy gate electrodes 215 and 215a are exposed. The first and second dummy gate electrodes 215 and 215a, and the first and second dummy gate insulation layer patterns 213 and 213a may be removed to form first and second openings (not illustrated) that expose top surfaces of the substrate 200 in the first and second regions I and II, respectively. A first gate insulation layer pattern 243 and a first gate electrode 245 may be sequentially formed in the first opening, and a second gate insulation layer pattern 243a and a second gate electrode 245a may be sequentially formed in the second opening. The first gate insulation layer pattern 243 and the first gate electrode 245 may define a first gate structure. The second gate insulation layer pattern 243a and the second gate electrode 245a may define a second gate structure.

A first hard mask layer 253 and a second hard mask layer 255 may be sequentially formed on the first insulating interlayer 230, the first and second gate structures, and the respective first and second spacers 225 and 225a.

Figure 17:
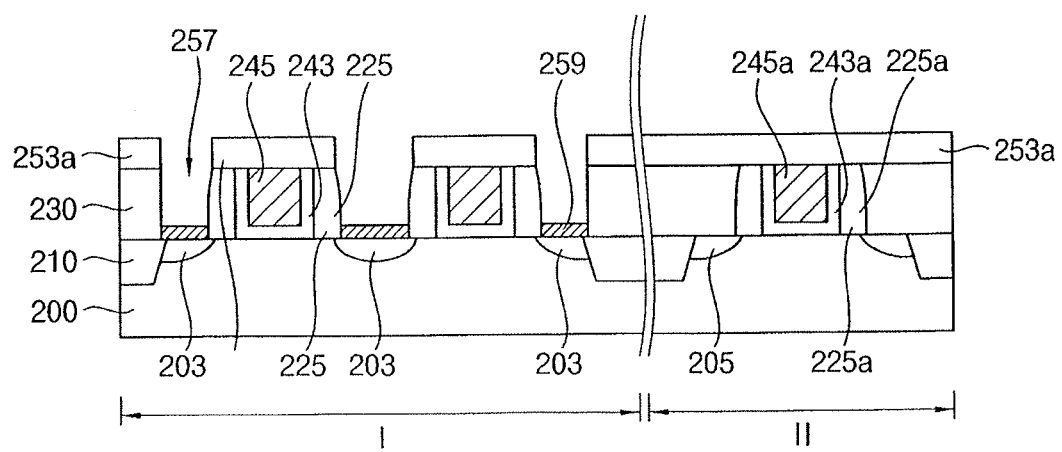

Referring to FIG. 17, stages substantially the same as or similar to those illustrated with reference to FIG. 6 may be performed. For example, a first hard mask 253a may be formed on the first and second gate structures, the first and second spacers 225 and 225a, and portions of the first insulating interlayer 230. First contact holes 257 may be formed to expose the first impurity regions 203 in the first region I. For example, the first contact holes 257 may be excluded, e.g., not formed, in the second region II. Metal silicide patterns 259 may be formed on the first impurity regions 203 in the first region I exposed by the first contact holes 257. The metal silicide patterns 259 may be excluded, e.g., not formed, in the second region II.

Figure 18:
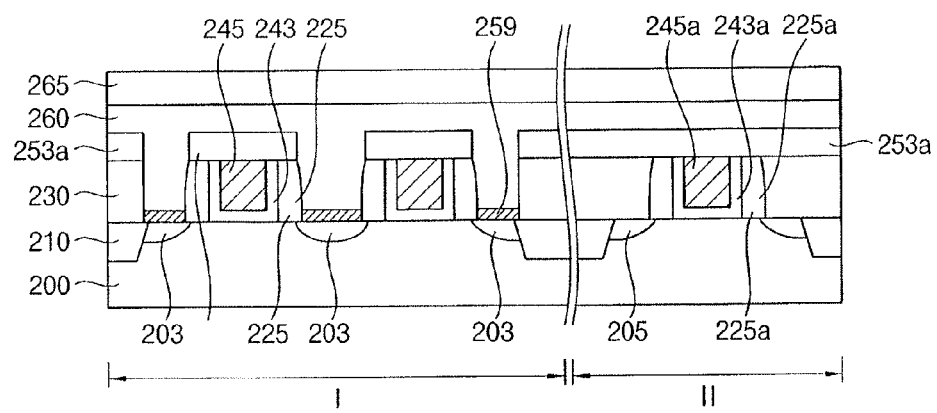

Referring to FIG. 18, stages substantially the same as or similar to those illustrated with reference to FIG. 7 may be performed. For example, a second insulating interlayer 260 may be formed on the first hard mask 253a, the metal silicide patterns 259, and the first spacer 225. For example, lower portions of the second insulating interlayer 260 may fill, e.g., completely fill, the first contact holes 257 in the first region I. Upper portions of the second insulting interlayer 260 in the first region I may cover the first hard mask 253a. The second region II may include, e.g., only include, upper portions of the second insulating interlayer 260 covering the first hard mask 253a. A third hard mask layer 265 may be formed on the second insulating interlayer 260 in both the first and second regions I and II.

Figure 19:
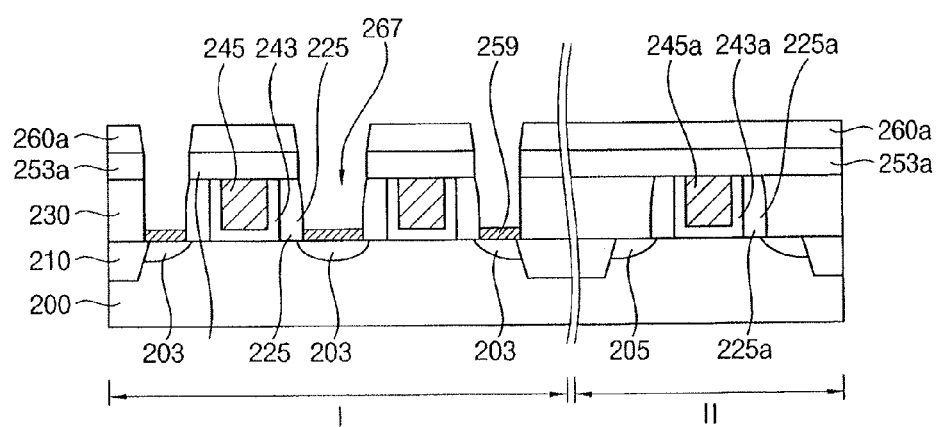

Referring to FIG. 19, stages substantially the same as or similar to those illustrated with reference to FIG. 8 may be performed. For example, an oxide pattern 260a may be formed on the first hard mask 253a. The oxide pattern 260a may be formed by patterning the second insulating interlayer 260. Second contact holes 267 may be formed to expose the metal silicide patterns 259 in the first region I. Second contact holes 267 may be excluded, e.g., not formed, in the second region II. The second contact holes 267 may be formed by removing portions of the second insulating interlayer 260.

Figure 20:
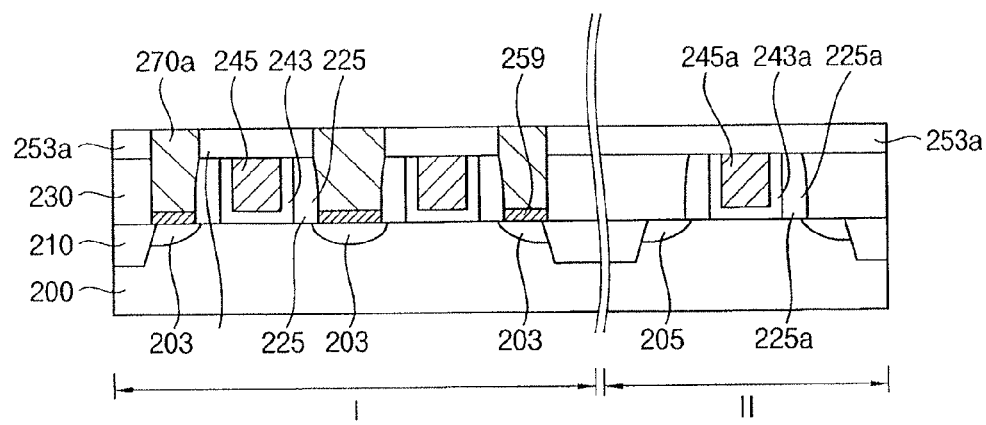

Referring to FIG. 20, stages substantially the same as or similar to those illustrated with reference to FIGS. 9 and 10 may be performed. For example, first plugs 270a electrically connected to the metal silicide patterns 259 may be formed in the first region I to fill the second contact holes 267. The oxide pattern 260a may be removed during the formation of the first plugs 270a. An upper surface of the first plugs 270a may be substantially coplanar with a top surface of the first hard mask 253a.

Figure 21:
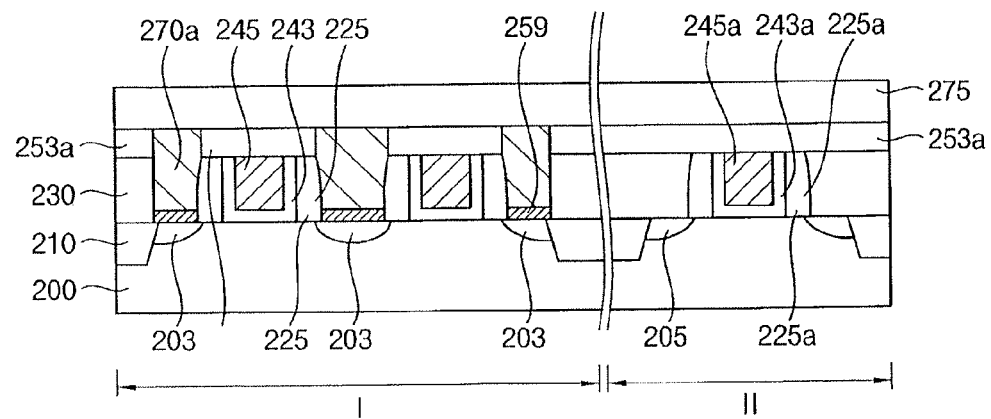

Referring to FIG. 21, a third insulating interlayer 275 may be formed on the first plugs 270a and the first hard mask 253a in the first and second regions I and II. According to an exemplary embodiment, the third insulating interlayer 275 may be formed using the same material as that of the first and second insulating interlayers 230 and 260.

Figure 22:
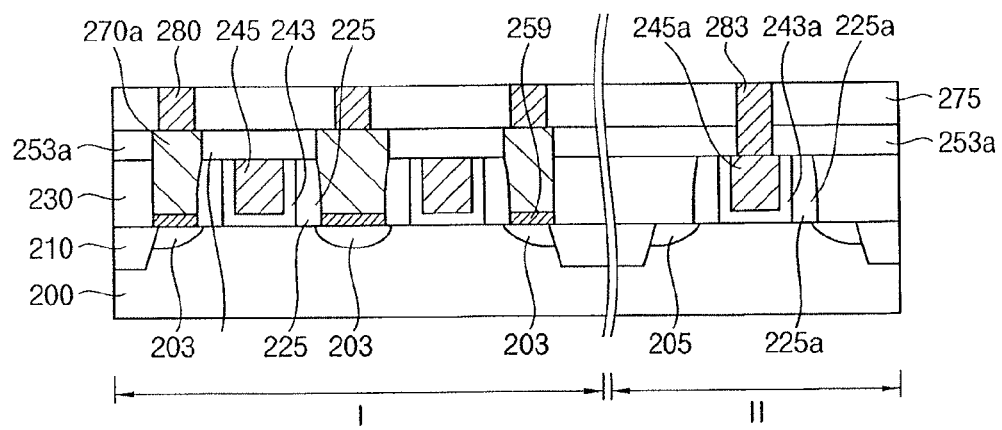

Referring to FIG. 22, the third insulating interlayer 275 in both the first and second regions I and II and the first hard mask 253a in the second region II may be partially removed by, e.g., a photolithography process using a photoresist pattern. Thus, third contact holes (not illustrated) exposing the first plugs 270a in the first region I and a fourth contact hole (not illustrated) exposing the second gate electrode 245a in the second region II may be formed. A conductive layer (not illustrated) may be formed on the third insulating interlayer 275, the first plugs 270a, and the second gate electrode 245a to fill the third and fourth contact holes. An upper portion of the conductive layer may be planarized until a top surface of the third insulating interlayer 275 is exposed to form second plugs 280 in the third contact holes and a third plug 283 in the fourth contact hole. The second and third plugs 280 and 283 may be electrically connected to the first plugs 270a and the second gate electrode 245a, respectively. The conductive layer may be formed using a metal, e.g., at least one of tungsten, ruthenium, platinum, tantalum, iridium, etc.

Wirings (not illustrated) electrically connected to the second and/or third plugs 280 and 283 may be formed above the second and third plugs 280 and 283, e.g., similar to as illustrated in FIG. 11. A protection layer (not illustrated) covering the wirings may be further formed in both to the first and second regions I and II to obtain a semiconductor device.

Figure 23:
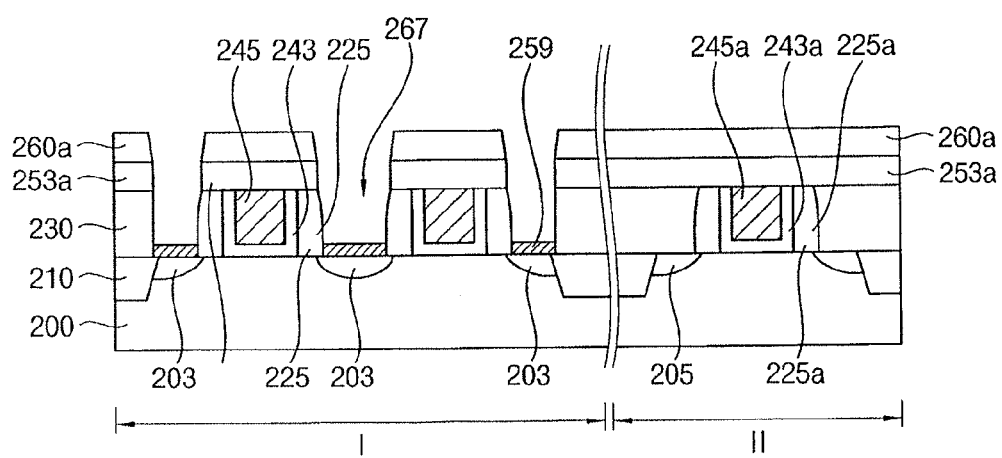
FIGS. 23 to 24 illustrate cross-sectional views depicting stages in a method of manufacturing a semiconductor device, according to an exemplary embodiment.
Figure 24:
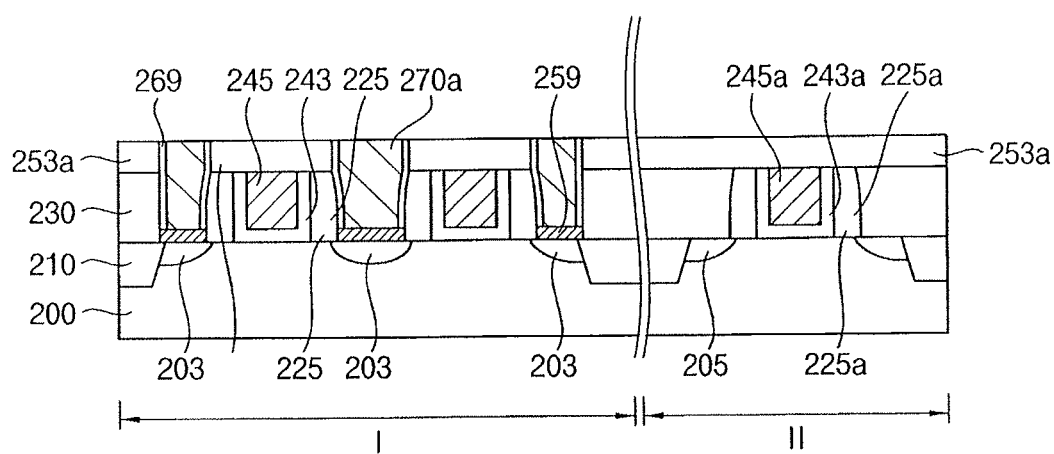

FIGS. 23 to 24 illustrate cross-sectional views depicting stages in an exemplary method of manufacturing a semiconductor device. The method may be substantially the same as or similar to that illustrated with reference to FIGS. 1 to 11 and 15 to 22, except an offset spacer may be formed. Stages in the exemplary method for forming the offset spacer may be substantially the same as or similar to those illustrated with reference to FIGS. 12 to 14. Therefore, detailed explanations of like elements, methods, and/or stages may be omitted herein.

Referring to FIG. 23, stages substantially the same as or similar to those illustrated with reference to FIGS. 15 to 19 may be performed.

Referring to FIG. 24, stages substantially the same as or similar to those illustrated with reference to FIGS. 13 to 14 may be performed.

According to an exemplary embodiment, offset spacers 269 may be formed on sidewalls of the first spacer 225, on sidewalls of the first hard mask 253a, and on portions of the metal silicide patterns 259. The offset spacers 269 may not be formed, e.g., may be excluded, in the second region II. Each first plug 270a may be formed surrounded by adjacent offset spacers 269 and on one metal silicide pattern 259. By forming the offset spacers 269, an additional distance between the first plug 270a and the first gate electrode 245 may be obtained. Afterwards, stages substantially the same as or similar to those illustrated with reference to FIGS. 21 and 22 may be performed to obtain a semiconductor device.

By way of summation and review, a metal gate may be formed using a damascene process. After forming the metal gate, a metal silicide layer may be formed on a top surface of a substrate adjacent to the metal gate, and a contact plug may be formed on the metal silicide layer. However, as semiconductor devices have been highly integrated, the distance between gate structures has become smaller. As a result, a process margin for forming the metal silicide layer and the contact plug may be reduced.

In contrast, embodiments, e.g., the exemplary embodiments discussed above, may relate to methods of forming a metal silicide layer and a contact plug with an enhanced process margin and/or in a self-aligned manner. Further, embodiments may relate to a method of forming a semiconductor device including a metal gate with an enhanced process margin. An exemplary embodiment, as discussed above, may include an offset spacer further formed on sidewalls of the first hard mask, on sidewalls of the first spacer, and on a portion of the metal silicide pattern. The offset spacer may be formed prior to forming the first plug so that the first plug is surrounded by the offset spacer.

According to example embodiments, a hard mask including silicon nitride may be formed on a gate electrode and a silicide pattern may be formed on an impurity region in a self-aligned manner using the hard mask. A contact plug may be also formed on the silicide pattern in a self-aligned manner using the hard mask. Therefore, the silicide pattern and the contact plug may be formed by a relatively simplified process with an enhanced process margin.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed above could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but are to include deviations in shapes that result, e.g., from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures may be schematic in nature and their shapes may not be intended to illustrate the actual shape of a region of a device and are not intended to limit the scope of the present inventive concept.

Unless otherwise defined, all terms (including technical and scientific terms) used herein may have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments have been disclosed herein, and although specific terms are employed, they are used and are to be interpreted in a generic and descriptive sense only and not for purpose of limitation. For example, it is to be understood that the foregoing is illustrative of various example embodiments and is not to be construed as limited to the specific example embodiments disclosed, and that modifications to the disclosed example embodiments, as well as other example embodiments, are intended to be included within embodiments. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the present invention as set forth in the following claims.

What is claimed is:

1. A semiconductor device, comprising:
a substrate;
a plurality of gate spacers on the substrate, a pair of the gate spacers defining an opening therebetween through which a top surface of the substrate is exposed;
a gate structure filling the opening, the gate structure including:
a gate insulation layer pattern on the top surface of the substrate and inner sidewalls of the pair of the gate spacers; and
a gate electrode on the gate insulation layer pattern, a bottom and a sidewall of the gate electrode being surrounded by the gate insulation layer pattern;
a hard mask on the pair of the gate spacers and the gate structure;
a source/drain region formed at an upper portion of the substrate adjacent to the gate structures; and
a plug electrically connected to the source/drain region, an upper portion of the plug being interposed between sidewalls of the hard mask.

2. The semiconductor device of claim 1, wherein the gate insulation layer pattern includes a metal oxide, and the gate electrode includes a metal.

3. The semiconductor device of claim 1, wherein the hard mask is directly on the pair of the gate spacers, the gate electrode, and the gate insulation layer pattern.

4. The semiconductor device of claim 1, wherein top surfaces of the pair of the gate spacers, the gate insulation layer pattern, and the gate electrode are coplanar with each other.

5. The semiconductor device of claim 1, further comprising a metal silicide pattern on the source/drain region, the metal silicide pattern protruding from the top surface of the substrate.

6. The semiconductor device of claim 1,
wherein a lower portion of the plug is interposed between the gate spacers neighboring each other.

7. The semiconductor device of claim 6, wherein the offset spacer is formed on a sidewall of the lower portion of the plug.

8. The semiconductor device of claim 7, wherein the offset spacer is interposed between the gate spacer and the lower portion of the plug.

9. The semiconductor device of claim 1, wherein upper surfaces of the hard mask and the plug are substantially coplanar with each other.

10. The semiconductor device of claim 1, wherein the hard mask includes silicon nitride.

11. A semiconductor device, comprising:
a substrate;
a plurality of gate spacers on the substrate, a pair of the gate spacers defining an opening therebetween through which a top surface of the substrate is exposed;
a gate structure filling the opening, the gate structure including:
a gate insulation layer pattern on the top surface of the substrate and inner sidewalls of the pair of the gate spacers; and
a gate electrode on the gate insulation layer pattern, a bottom and a sidewall of the gate electrode being surrounded by the gate insulation layer pattern;
a hard mask on the pair of the gate spacers and the gate structure;
a source/drain region formed at an upper portion of the substrate adjacent to the gate structure;
a first plug electrically connected to the source/drain region, the sidewall of the first plug being formed on sidewalls of the hard mask and the gate spacer; and
a second plug electrically connected to the first plug.

12. The semiconductor device of claim 11, wherein the second plug directly contacts the first electrode.

13. The semiconductor device of claim 12, wherein a bottom of the second plug is within an upper surface of the first plug.

14. The semiconductor device of claim 11, further comprising,
a third plug electrically connected to the gate structure.

15. The semiconductor device of claim 14, wherein the third plug directly contacts the gate electrode.

16. A semiconductor device, comprising:
a substrate;
a plurality of gate spacers on the substrate, a pair of the gate spacers defining an opening therebetween through which a top surface of the substrate is exposed;
a gate structure filling the opening, the gate structure including:
a gate insulation layer pattern on the top surface of the substrate and inner sidewalls of the pair of the gate spacers; and
a gate electrode on the gate insulation layer pattern, a bottom and a sidewall of the gate electrode being surrounded by the gate insulation layer pattern;
a hard mask on the gate spacer and the gate structure;
a source/drain region formed at an upper portion of the substrate adjacent to the gate structure;
a metal silicide pattern formed on the source/drain region and protruding from the top surface of the substrate; and
a first plug formed through the hard mask and electrically connected to the metal silicide pattern.

17. The semiconductor device of claim 16, wherein top surfaces of the pair of the gate spacers and the gate structure are coplanar with each other, and
the hard mask is directly on the top surfaces of the pair of the gate spacers and the gate structure.

18. The semiconductor device of claim 17, wherein upper surfaces of the hard mask and the first plug are substantially coplanar with each other.

19. The semiconductor device of claim 16, further comprising an offset spacer between the plug and the gate spacer.

20. The semiconductor device of claim 16, further comprising a second plug electrically connected to the first plug, wherein the second plug does not contact the hard mask.

* * * * *